United States Patent

Freeman

[11] Patent Number: 5,959,303
[45] Date of Patent: Sep. 28, 1999

[54] GENERATOR OF RIBBON-SHAPED ION BEAM

[76] Inventor: James Harry Freeman, c/o AEA Technology plc, Pantents Department, 329 Harwell, Didcot, Oxfordshire, OX11 ORA, United Kingdom

[21] Appl. No.: 09/241,120

[22] Filed: Feb. 1, 1999

Related U.S. Application Data

[63] Continuation of application No. 08/875,822, Aug. 7, 1997, Pat. No. 5,866,909.

[30] Foreign Application Priority Data

Feb. 18, 1995 [GB] United Kingdom .................. 95 03220

[51] Int. Cl.⁶ ..................................................... B01D 59/44
[52] U.S. Cl. ................................. 250/396 ML; 250/423 R
[58] Field of Search ......................... 250/396 ML, 396 R, 250/423 R, 281, 287, 296, 298, 492.21

[56] References Cited

U.S. PATENT DOCUMENTS 5,866,909   2/1999   Freeman ............................. 250/423 R Primary Examiner—Kiet T. Nguyen
Attorney, Agent, or Firm—William H. Holt

[57] ABSTRACT

A mass-analysed ion beam generator in which the ion beam is in the form of a thin flat ribbon with its major transverse dimension aligned parallel with the direction of the mass-analysing magnetic field.

4 Claims, 2 Drawing Sheets

GENERATOR OF RIBBON-SHAPED ION BEAM

This is a continuation of application Ser. No. 08,875,822 filed Aug. 7, 1997, now U.S. Pat. No. 5,866,909.

The present invention relates to ion beam generators of the type in which a beam of mixed ions initially is produced and the beam of mixed ions is subjected to the action of a magnetic field so as to select one or more specific types of ions.

Figure 1:
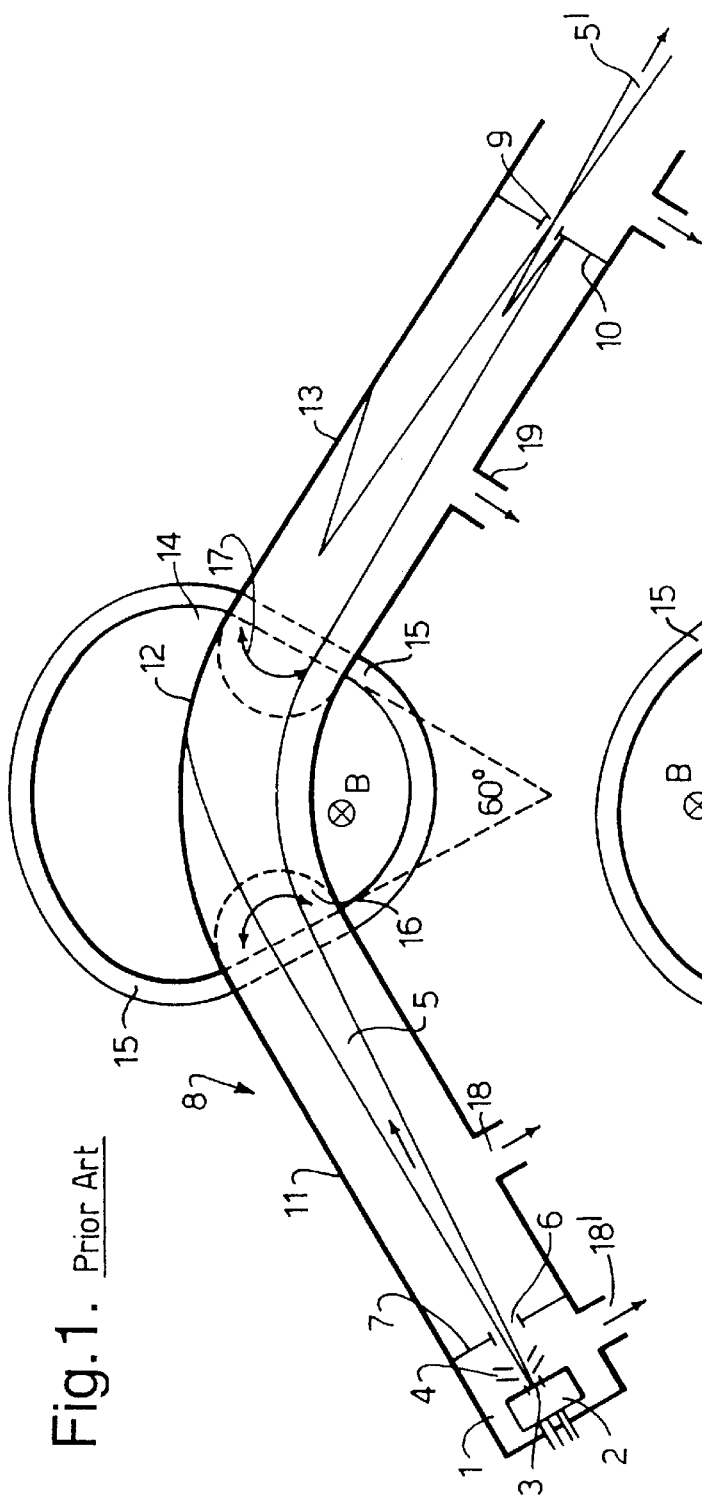

Ion beam generators which utilise the principle of an Aston mass spectrometer to produce beams of selected ions are well known and have been available for many years. A typical such ion beam generator is shown in FIG. 1 of the accompanying drawings and consists of an ion source 1 including an ion production chamber 2 which has an exit aperture 3 and an ion extraction/acceleration electrode system 4. A beam of ions 5 produced by the ion source 1 passes through an entrance aperture 6 in a diaphragm 7 into an ion flight tube 8 which has an exit aperture 9 in a second diaphragm 10. The ion flight tube 8 has a first straight section 11, an arcuate section 12 and a second straight section 13. The arcuate section 12 of the ion flight tube 8 is situated within the pole pieces 14 of an electromagnet 15 which is arranged to produce a magnetic field B perpendicular to the plane of the ion flight tube 8. In the example shown in FIG. 1 the magnetic field is homogeneous and the sector angle of the arcuate section 12 of the ion flight tube 8 is 60°. The pole pieces 14 of the electromagnet 15 have rotatable portions 16 and 17 where the ion beam 5 enters and leaves the magnetic field B, respectively. The rotatable portions 16 and 17 of the pole pieces 14 of the electromagnet 15 enable the configuration of the ion beam 5 to be varied if desired. Two ports 18 and 19 enable the ion flight tube 8 to be evacuated to a dynamic vacuum of about $10^{-5}$ torr. The ion source 1 also has a port 18' by means of which the same level of vacuum can be maintained in it.

As can be seen from FIG. 1, the ion beam 5 is divergent as it enters the ion flight tube 8 and continues to be so throughout its passage through the first straight section 11 and the arcuate section 12 of the ion flight tube 8. A typical angle of divergence is 5 degrees. This angle of divergence may not seem to be large, but, in practice, in cases where a number of ions are present in the beam of ions 5, a considerable portion of the heavier ions will impinge on the walls of the arcuate section 12 and the first part of the second straight section 13 of the ion flight tube 8. FIG. 1 shows the position in the case where boron trifluoride is used with the object of providing $^{11}B^+$ ions for use in the production, by ion implantation of semiconductor devices. In this case, ions of $^{10}BF^+_2$; $^{11}BF^+_2$; $^{10}BF^+$; $^{11}BF^+$; $F^+$; $^{10}B^+$ and $^{11}B^+$ all are present in the ion beam 5. If the energy of the ion beam 5 is sufficient, this can lead to appreciable sputtering of material from a relatively large area of the said portions of the ion flight tube 8. Most of this sputtered material having randomly orientated flight paths and relatively low energy will be re-deposited on the walls of the ion flight tube or be extracted by the vacuum system. For many purposes, what remains, and which becomes entrained in the desired ion beam or otherwise finds its way through the exit aperture 9 in the diaphragm 10 is relatively unimportant, but if the final ion beam 5' produced by the ion beam generator is to be used in the production of semiconductor devices, then such sputtered impurities can be of great importance, particularly in the case of the production of very large scale integrated circuit devices. At present, to reduce the level of such contamination of the final ion beam 5', the relevant parts of the ion flight tube 8 may be lined with a material, such as silicon, which has no effect on the semiconductor wafer which is being treated. Also, additional pumping and beam deflection systems at the output end of the ion flight tube 8 may be employed, which adds both to the size and cost of ion implanters for the production of semiconductor devices which employ such ion beam generators.

European patent specification EP 0 139 177 discloses a magnetically analysed ion implantation apparatus which employs an ion beam generator of the above type in which the ion beam is not only initially divergent in the dispersion plane, but also is divergent perpendicularly to the dispersion plane and this is claimed as the novel feature of the apparatus.

GB patent specification 934,153 discloses a form of mass spectrometer in which the ion beam to be analysed has a rectangular cross-section, which has its major dimension initially parallel to the dispersion plane of the analysing magnetic field, but it is so strongly focused in that plane that at the moment of entry into the analysing magnetic field the major dimension of the ion beam is perpendicular to the dispersion plane of the magnetic field.

The system disclosed not only requires exact focusing at an entrance slit to the magnetic field, but also a precise angle of incidence at the boundary of the magnetic field. It is, therefore, both difficult to operate in practice and requires sophisticated and therefore expensive control systems.

Figure 2:
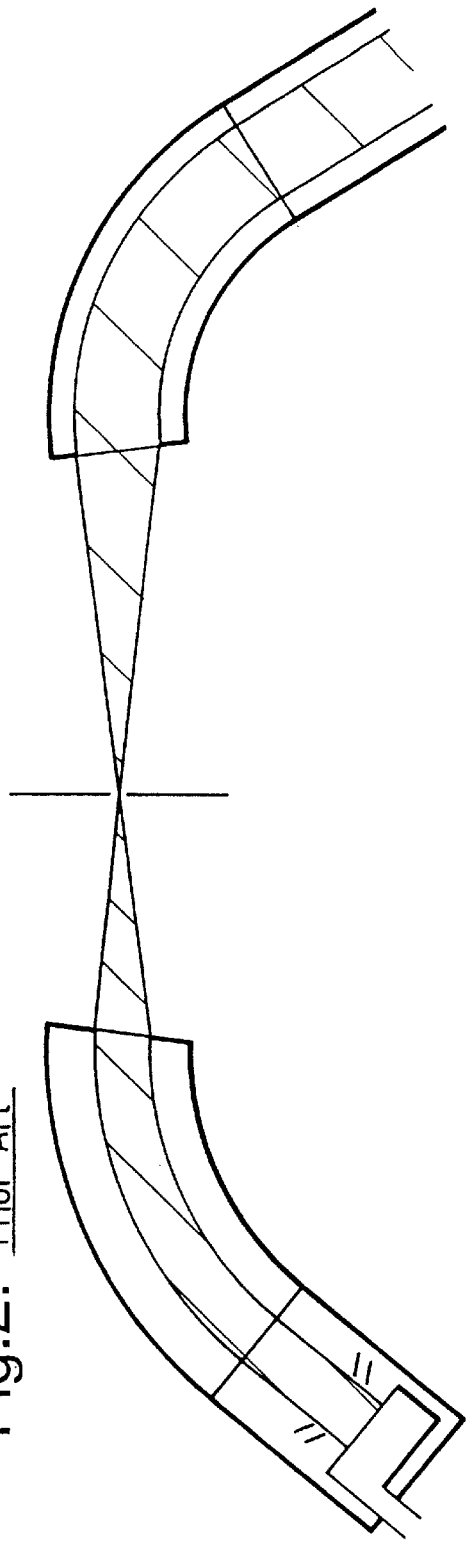

In another proposed type of mass-analysed ion beam generator, a ribbon-like ion beam which has parallel sides in one plane and little or no divergence in the orthogonal plane is passed through a magnetic field which is perpendicular to the major plane of the ion beam. Desired ions are brought to a focus at a resolving aperture and a second similarly oriented magnetic field is used to reconstitute the divergent beam of ions passing through the resolving aperture into another flat parallel sided ion beam. Two such systems are described in principle in "Ion Beams in Prospect" by the present inventor published in Ion Implantation Technology, 92, pp 357–364 and one of them is illustrated in FIG. 2 of the accompanying drawings. This beam geometry has some advantages over the previously described system but has the disadvantage that unless the parallelism of the ion beam is very accurate and strictly controlled, the resolution of the separator can suffer leading to the possible contamination of the final ion beam with unwanted ions. Also it is difficult to maintain a constant intensity across the width of the ion beam.

It is an object of the present invention to provide an improved ion beam generator of the mass-analysed type.

According to the present invention there is provided An ion beam generator including an ion source adapted to produce a beam of ions including ions of a desired type and having a rectangular cross-section, an ion flight tube including a first straight section, an arcuate middle section and a second straight section terminating in a closure with an axially located exit aperture for the desired ions selected from the beam of ions produced by the ion source and means for establishing in the region of the arcuate section of the ion flight tube a magnetic field substantially perpendicular to the plane of the axis of the ion flight tube such as to cause the selected ions to pass through the exit aperture of the ion flight tube, wherein the cross-section of the ion beam is substantially constant prior to entering the magnetic field and the major transverse dimension of the ion beam is parallel to the direction of the magnetic field.

This geometry combines the virtues of both the prior art types of mass-analysed ion beam generators while avoiding their disadvantages. The parallel alignment of the major transverse dimension of the ion beam with the magnetic field restores the resolution of the first type of prior mass-analysed ion beam generator, while avoiding the harmful effects of transverse beam divergence, without requiring the sophisticated control of the initial ion beam shape and post-selection ion beam reformation that the second type of prior mass-analysed ion beam generator requires if it is to be successful.

The lack of transverse beam divergence (change in the minor transverse dimension of the ion beam) allows the ion flight tube to be divided into sections by means of a plurality of diaphragms which have one or more slits aligned along the beam path of a selected ion, or ions, to be produced by the ion beam generator, so allowing much improved differential pumping of the various sections of the flight tube to be employed, with the maximum pumping being applied to the region of the ion source and to that part of the ion flight tube where ions may impinge on the wall of the ion flight tube and cause the sputtering of material therefrom. Should such sputtering occur, the diaphragms will tend to trap sputtered material in the region where it is produced, so reducing the chance of it contaminating the final ion beam. This, as stated before, is an important consideration for ion beam generators for use in ion implanters for the production of large scale integrated circuit devices. Also, the overall vacuum in the ion flight tube for a given pumping capacity is improved, so reducing losses from the ion beam and contamination of the ion beam by charge-exchange and other collisions with residual gases in the ion flight tube.

Another important consequence of the parallel alignment of the major transverse dimension of the ion beam with the magnetic field and the lack of transverse beam divergence is that both the straight sections of the ion flight tube can be greatly reduced in length; indeed, at least the first one can be dispensed with if so desired. Thus the overall dimensions of the ion beam generator can be reduced considerably, further reducing the overall pumping requirement of the ion beam generator, and the size of an ion beam implantation apparatus utilising the ion beam generator of the invention.

A further important advantage of the present invention is that the parallel-sided ion beam (possibly with convergence in the other plane) is particularly well suited for the injection of ions into a process chamber. Divergent beams such as those produced by the arrangement shown in FIG. 1 may require focusing after the mass-analysis stage.

Figure 3:
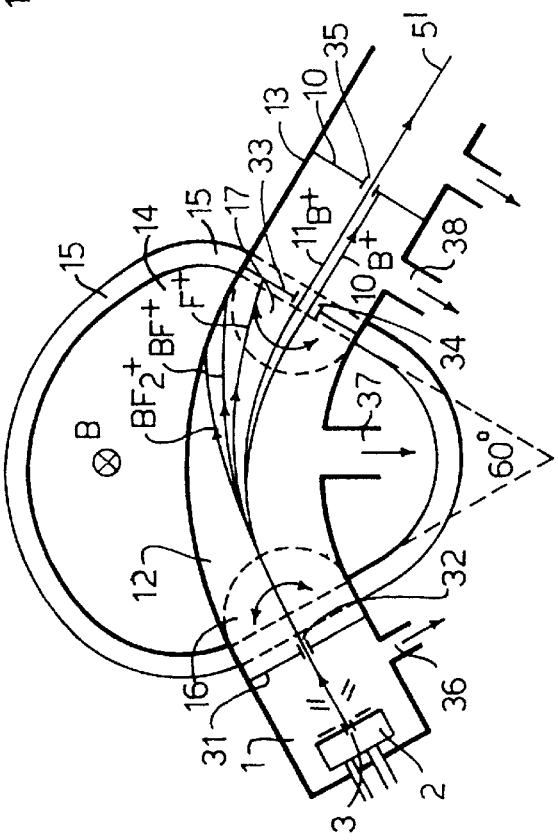
Figure 4:
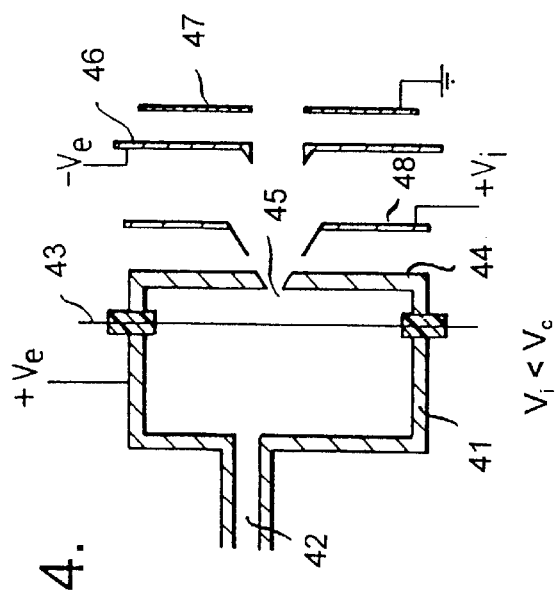

The invention will now be described, by way of example, with reference to the accompanying drawings in which, FIG. 1 shows diagrammatically a first type of known mass-analysed ion beam generator, FIG. 2 shows diagrammatically a second, proposed type of mass-analysed ion beam generator, FIG. 3 shows diagrammatically, a mass-analysed ion beam generator embodying the invention, and FIG. 4 shows diagrammatically an ion source suitable for use in carrying out the present invention.

Referring to FIG. 1 of the drawings, there is shown a known form of mass analysed ion beam generator, which has been described earlier in this specification. The ion beam generator is set up to provide $^{11}B^{30}$ ions for use in the production of semiconductor devices, and includes an ion source 1, which is an ion source of the Freeman type, and which contains boron trifluoride vapour at a pressure of about $10^{-3}$ torr. The ion production chamber 1 produces a whole range of ions of both isotopes of boron, among which are $BF^+_2$, $BF^+$, $F^+$ and $B^+$ which together form the divergent beam of ions 5, the envelope of which is shown in FIG. 1.

It can be seen that ions of $BF^+_2$, $BF^+$ and $F^+$ impinge upon a considerable area of the inner surfaces of the arcuate section 11 and the second straight section 12 of the ion flight tube 8, with a considerable risk of causing the sputtering of material from the affected areas of those sections of the ion flight tube 7. Even if sputtering does not occur, the likelihood of contamination of the final ion beam 5' is considerable. Furthermore, in the case of high beam current generators such as those used in the production of large integrated circuit semiconductor devices, a considerable amount of energy is dumped into the wall of the ion flight cube 8.

FIG. 3 shows an ion beam generator embodying the present invention, drawn approximately to the same scale as that of FIG. 1. The general layout is the same as that of the ion beam generator of FIG. 1 and similar elements have the same reference numerals. The elements which are different in the ion beam generator embodying the invention are that the diaphragm 7 with its relatively large entrance aperture 6 is replaced by a diaphragm 31, which has a narrow slit aperture 32 aligned with the rectangular cross-section of the ion beam 5; the first straight section 11 of the ion flight tube 8 is eliminated; a second diaphragm 33, again with a slit aperture 34 aligned with the ion beam 5 is placed at the downstream end of the arcuate section 12 of the ion flight tube 8. The second straight section 13 of the ion flight tube 8 is only about a third of that of the ion beam source of FIG. 1; and the exit aperture 9 in the diaphragm 10 is again in the form of a slit 35 aligned with the cross-section of the final ion beam 5' issuing from the ion beam generator. Three pumping ports, 36, 37 and 38 are provided in the ion source 1, arcuate section 12 and second straight section 13 respectively.

The effect of these changes is to provide an ion beam generator which is approximately half the size as that of the ion beam generator of FIG. 1. Also, as can be seen, the paths of the various ions are well-defined, with none of the heavier ions penetrating beyond the diaphragm 33. As a result, the maximum pumping can be confined to the chamber formed by the diaphragm 31, the arcuate section 12 of the ion beam flight tube 8 and the diaphragm 33. Also, even though ions still impinge on the wall of the arcuate section 12 of the ion flight tube 8, the area over which this occurs is restricted and can be cooled relatively easily.

The ion source 1 is an ion source of the Freeman type in which a plasma is generated in a gaseous medium including the material ions of which are to be produced by the source. The ion source is illustrated in FIG. 4 and consists of a cylindrical ion chamber 41 which has an inlet 42 for the said gaseous medium, and a cathode electrode 43 positioned close to the other end wall 44 of the ion chamber 41. The end wall 44 of the ion chamber 41 has an axially placed exit aperture 45 in the form of a slit the dimensions of which correspond to those desired for the ion beam 5. Outside the wall 44 of the ion chamber 41 is a pair of extraction/acceleration electrodes 46 and 47 to the electrode 46 of which a negative potential is applied, both to extract positive ions from the ion chamber 41 and to accelerate them to an energy sufficient to carry them through the ion flight tube 8. The electrode 48 is at earth potential. A suitable potential for the electrode 46 is a negative potential of about 500 volts. A positive potential is applied to the ion chamber 41. This potential depends on the use to which the ion beam 5' is to be put and can be anything up to about 100 kV.

In normal circumstances such a source produces a diverging ion beam because of the shape of the boundary of the plasma which forms in the ion chamber 41 and the nature of the extraction systems 46 and 47, the ions being emitted from the plasma perpendicularly to the boundary of the plasma. In the present invention the plasma boundary is made to be plane, so ensuring that a parallel sided ion beam is emitted. This is done by means of an auxiliary electrode 48 placed between the ion chamber 41 and the extraction/acceleration electrodes 46 and 47. The potential applied to the electrode 48 is adjusted relative to that of the ion chamber 41 until the desired plasma boundary condition is reached and a flat parallel-sided beam of ions is produced by the ion source. Suitable values for the potential $V_i$ of the electrode 48 may be in the range 10–30 kV.

Such adjustment of the voltage of the auxiliary electrode 48 allows the extraction electric field for the production of the ion beam 5 to be rapidly and conveniently varied over wide limits without affecting the final energy of the ion beam 5. Moreover, as the auxiliary electrode 48 provides an intermediate electrostatic barrier between the ion chamber 41 and the extraction/accelerator electrodes 46 and 47, it has the additional advantage that it reduces the chance of electrical breakdown and the production of X-rays. This is because for similar extraction conditions at the boundary of the plasma in the ion chamber 41, the voltage difference between the ion chamber 41 and the auxiliary electrode 48 is less than it would be in the case of a conventional Freeman-type or similar ion source in which there is no auxiliary electrode.

Other plasma ion sources and other extraction systems, for (example, can be used instead of a Freeman-type ion source, but they must be capable of producing parallel-sided ion beams.

I claim:

1. In an ion implanter, an ion beam generator including an ion source for producing a beam of ions having a cross-section with a major transverse dimension, an ion flight tube including at least an arcuate section and an axially located exit aperture for the ions selected from the beam of ions produced by the ion source and a magnetic field generator for establishing in the region of the arcuate section of the ion flight tube a magnetic field substantially perpendicular to the plane of the axis of the ion flight tube such as to cause the selected ions to pass through the exit aperture of the ion flight tube, wherein the cross-section of the ion beam is substantially constant prior to entering the magnetic field and the major transverse dimension of the ion beam is parallel to the direction of the magnetic field.

2. An ion beam generator according to claim 1 wherein the flight tube includes a straight section after the arcuate section and there is included a first diaphragm situated immediately prior to the arcuate section, a second diaphragm situated at the end of the arcuate section and a third diaphragm situated in the straight section each of the diaphragms having an axial slit aperture aligned perpendicular to the dispersion plane of the magnetic field, and each chamber formed by the diaphragms is provided with a pumping port for evacuating each said chamber for reducing pressures at different rates.

3. An ion beam generator according to claim 1 wherein said ion source comprises a chamber for containing a plasma, said chamber having an exit slit, an electrode system for extracting ions from the plasma within the chamber, and a plasma control electrode situated between said electrode system and the exit slit for controlling the shape of the boundary of the plasma in the chamber adjacent to the exit slit for causing a parallel-sided beam of ions to be extracted from the chamber.

4. In an ion implanter, an ion beam generator including an ion source for producing a beam of ions and having a crosssection with a major transverse dimension, an ion flight tube including at least an arcuate section and an axially located exit aperture for the ions selected from the beam of ions produced by the ion source and a magnetic field generator for establishing in the region of the arcuate section of the ion flight tube a magnetic field substantially perpendicular to the plane of axis of the ion flight tube such as to cause the selected ions to pass through the exit aperture of the ion flight tube, wherein said major transverse dimension of the ion beam is parallel to the direction of the magnetic field, said ion source comprising a chamber for containing a plasma, said chamber having an exit slit, an electrode system for extracting ions from the plasma within the chamber and a plasma control electrode situated between said electrode system and the exit slit for controlling the shape of the boundary of the plasma in the chamber adjacent to the exit slit.

* * * * *